United States Patent [19]

Green

[11] 4,323,719

[45] Apr. 6, 1982

[54] INTEGRATED SOLAR CELLS AND SHUNTING DIODES

[75] Inventor: Martin A. Green, Bondi, Australia

[73] Assignee: Unisearch Limited, Kensington, Australia

[21] Appl. No.: 181,374

[22] Filed: Aug. 22, 1980

[30] Foreign Application Priority Data

Aug. 23, 1979 [AU] Australia .............................. PE0167

[51] Int. Cl.³ ...................... H01L 31/06; H01L 31/18
[52] U.S. Cl. .................... 136/249; 29/572;
29/591; 136/244; 136/255; 357/30
[58] Field of Search .................. 136/244, 249, 255;
357/30; 29/572, 591

[56] References Cited

U.S. PATENT DOCUMENTS 3,887,935  6/1975  Fischer et al. ..................... 357/15
3,912,539  10/1975  Magee ............................. 136/244
4,042,418  8/1977  Biter ................................ 136/249

FOREIGN PATENT DOCUMENTS 1320775  2/1963  France ............................. 136/244

OTHER PUBLICATIONS

M. A. Green et al., "Silicon Solar Cells With Integral Bypass Diodes", *Solar Cells*, vol. 3, pp. 233–244, (May 1981).
W. J. Biter et al., "An Automatable Integrated Thin Film Solar Cell Array", *Conf. Record, 12th IEEE Photovoltaic Specialists Conf.*, (1976), pp. 466–470.

*Primary Examiner*—Aaron Weisstuch
*Attorney, Agent, or Firm*—Michael J. Striker

[57] ABSTRACT

A method of connecting a shunting diode in parallel with a solar cell for the purpose of improving the tolerance of an array of solar cells to mismatch in cell output, whether caused by physical differences in the cells, cell breakage, or the effect of shading, is disclosed. Also disclosed is a method of forming a plurality of interconnected solar cells on a single sheet of semiconductor material, wherein if required, each cell in the array of cells may be shunted by a diode.

6 Claims, 17 Drawing Figures

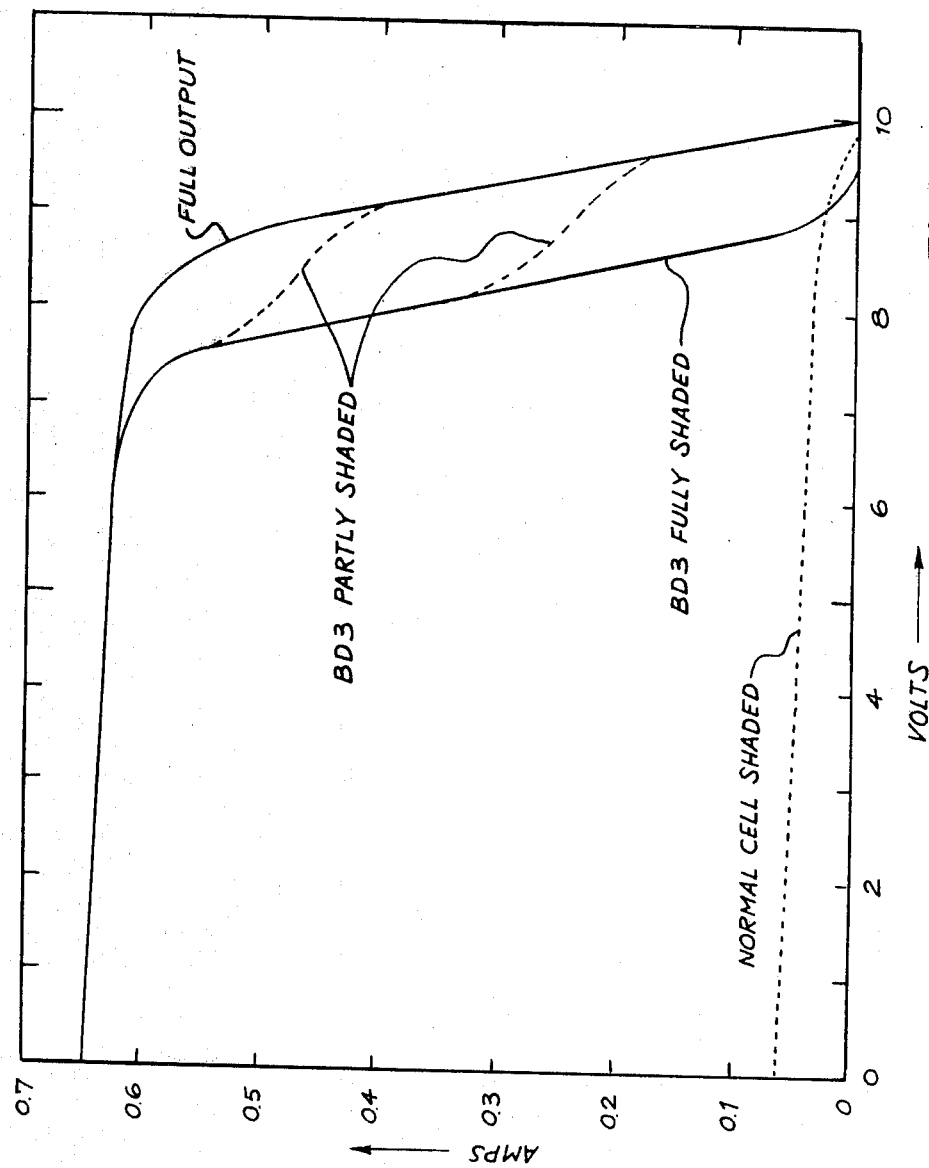

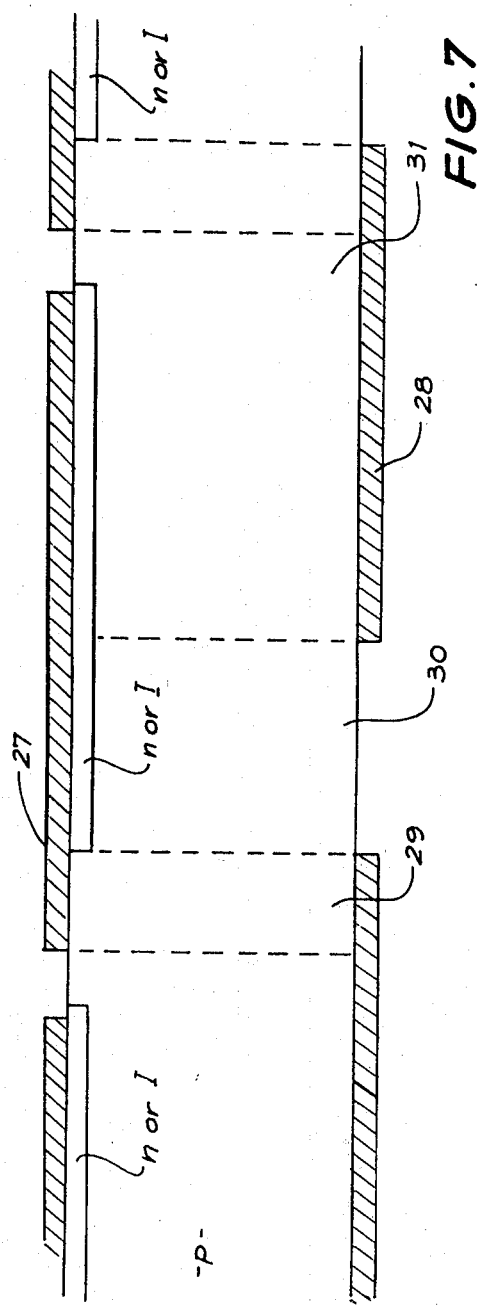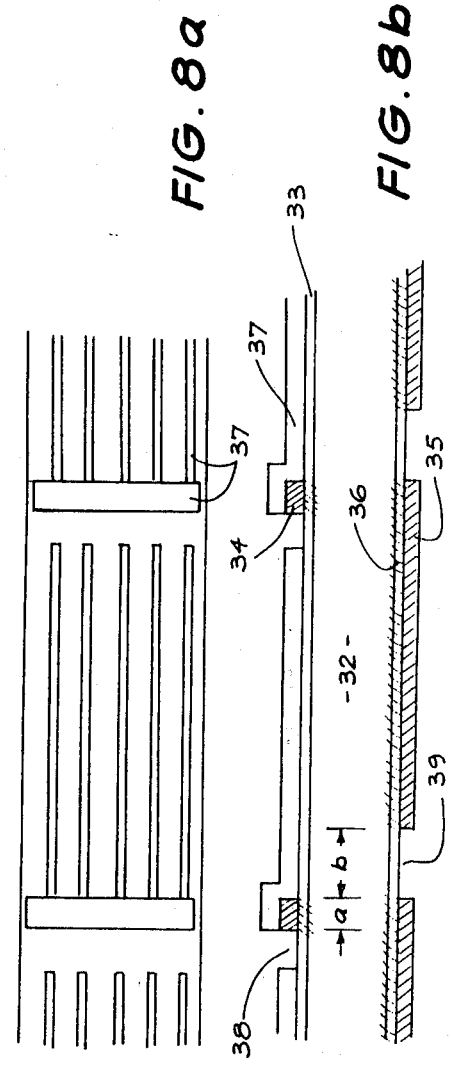

INTEGRATED SOLAR CELLS AND SHUNTING DIODES

The present invention relates to a method of integrating a shunting diode into a solar cell and to a method of forming an integrated array of solar cells on one substrate with or without integrated shunting diodes. The invention further relates to novel solar cell structures per se.

Solar cells convert sunlight directly to electrical power using the photovoltaic effect in a semiconductor. The cells are basically low voltage, high current output devices and they must be interconnected in series to produce working voltages.

Mismatch in the properties of interconnected cells can create operating problems in solar cell arrays. This mismatch may be due to physical differences in the cells such as arise during normal processing or may be caused by cell breakage. Alternatively, mismatch may be due to events external to the cell, for example, as would be caused by partial shading or shadowing of solar cell arrays, for example by falling leaves or bird droppings.

Regardless of origin, mismatch in output can give rise to at least two types of undesirable effects. The output current of series connected cells is determined by that of the worst cell. This means that mismatch causes some of the generating capability of interconnected cells to be wasted. Additionally, series connected cells are often forced to operate at low output voltages, for example, in some voltage regulation schemes and during array maintenance. In such cases, virtually all the power generated by the series connection can be dissipated in the lowest output cell. This can cause localized overheating and failure of the cell encapsulation.

The above undesirable effects of cell mismatch can be avoided by connecting a shunting diode across each cell or small group of cells. This diode can either be a discrete device or can be integrated into the cell structure.

It is an object of this invention to provide a new method of connecting a shunting diode in parallel with a solar cell for the purpose of improving the tolerance of an array of solar cells to mismatches in cell output, whether caused by physical differences in the cells, cell breakage, or the effect of shading. With the approach disclosed according to the present invention only the usual cell connections are required.

It is a further object of this invention to provide a method of forming a plurality of interconnected solar cells on a single sheet of semiconductor material such as silicon and to reduce the cost and increase the reliability of interconnecting a plurality of solar cells in series.

It is yet another object of this invention to provide an interconnected array of solar cells with each cell in the array shunted by a diode. Such an array has the advantages of each of the previous methods. Additionally, cells which are non-operational from the time of manufacture can be incorporated into the interconnected array with little degradation on the array performance.

The solar cells mentioned may have a variety of structures, for example, a conventional diffused p-n junction structure or a metal-thin insulator ($<40$ Å)-semiconductor or MIS structure.

The large majority of solar cells fabricated to date have been silicon p-n junction devices. These are large area junction diodes with their structure optimised to make most effective use of the incident sunlight. Normal p-n junction devices are formed starting from a thin disc of silicon 50–125 mm in diameter and 0.25–0.6 mm thick. This disc is normally doped with a p-type impurity, boron. Into the surface of the disc is diffused at high temperature an impurity (normally phosphorus) with n-type properties. This forms a very thin n-type layer about 0.2–0.5 $\mu$m thick and hence a p-n junction. An ohmic contact is made to the entire back surface of the cell by means of a deposited metal layer, normally heated to make good electrical contact through an underlying thin oxide layer or diffused region. Ohmic electrical contact is made to the diffused layer at the top of the cell by means of a metal grid. The grid keeps the series resistance low while blocking light from only a fraction of the total cell area. Optical losses are reduced by the application of a quarter-wavelength antireflection coating to the top of the cell or by chemically etching this region earlier in the processing sequence or by a combination of these approaches.

The other type of cell referred to above is the metal-thin insulator ($<40$ Å)-semiconductor or MIS device. These devices have been shown to possess electronic properties similar to ideal p-n junction diodes and therefore are capable of similar photovoltaic energy conversion properties.

A preferred method of manufacture of MIS cells is as follows. Silicon doped with a p-n type impurity is used as the substrate. After chemical cleaning, a thin oxide layer is formed on top and bottom surfaces, for example, by heating in air or other oxidizing medium. The next stage is to form a metal contact to the bottom of the silicon substrate. A suitable metal layer (e.g. aluminum) is deposited on the rear of the substrate and sintered for a short period (e.g. 15 minutes) at about 500° C. to allow the metal to make non-rectifying contact through the thin oxide layer. After this, the metal contact to the top of the silicon substrate is deposited. Preferably, the underlaying layer of this metal contact is aluminium or magnesium or titanium or a similar conductor with low effective work function for p-type substrates. The metal top contact has a fine grid type pattern defined, for example, by a metal mask or by photolithographic methods. As a final step, an antireflection coating of material such as SiO is deposited onto the surface of the device to reduce reflections from non-metal coated areas of the device. This antireflection coating also acts to passivate the surface of the underlying silicon.

The invention will be further described with reference to the drawings, in which:

FIG. 1a schematially illustrates a cross-sectioned side elevational view of an integration type shunting diode showing back-to-back diodes and isolation regions;

FIG. 1b represents a lumped equivalent circuit of the shunting diode of FIG. 1a;

Figure 4:
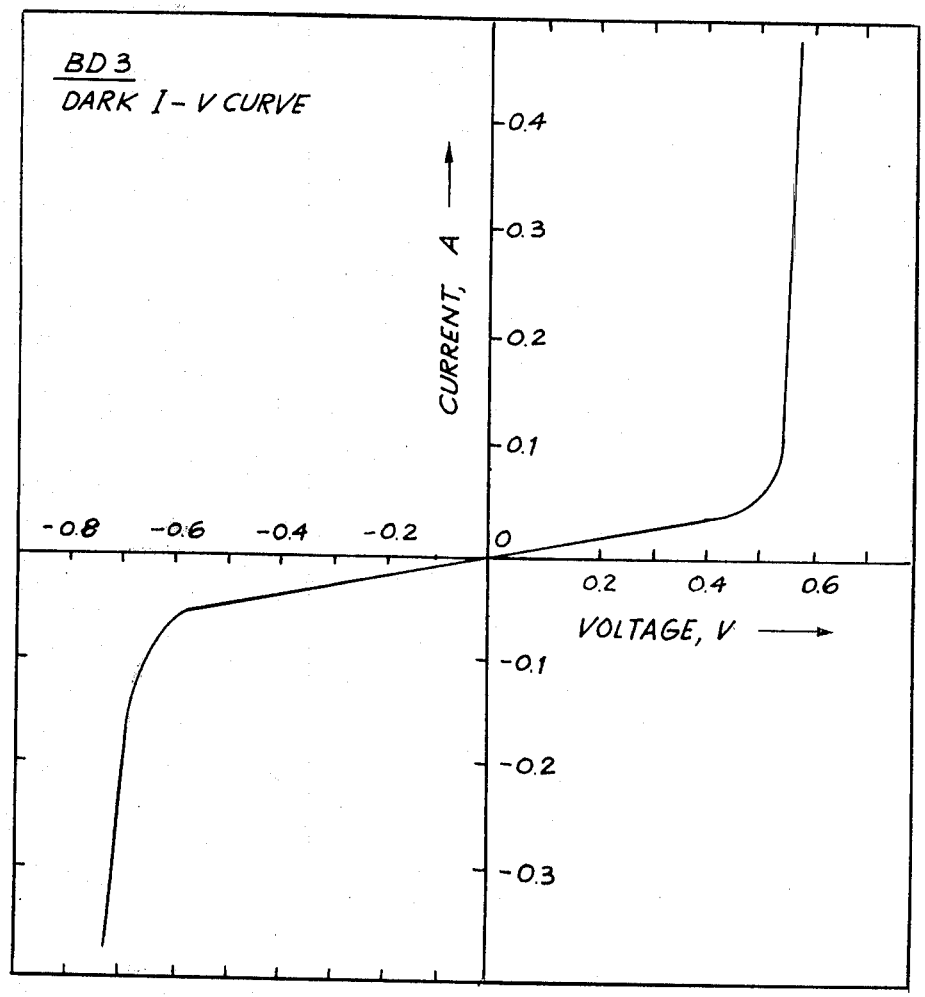
Figure 5:
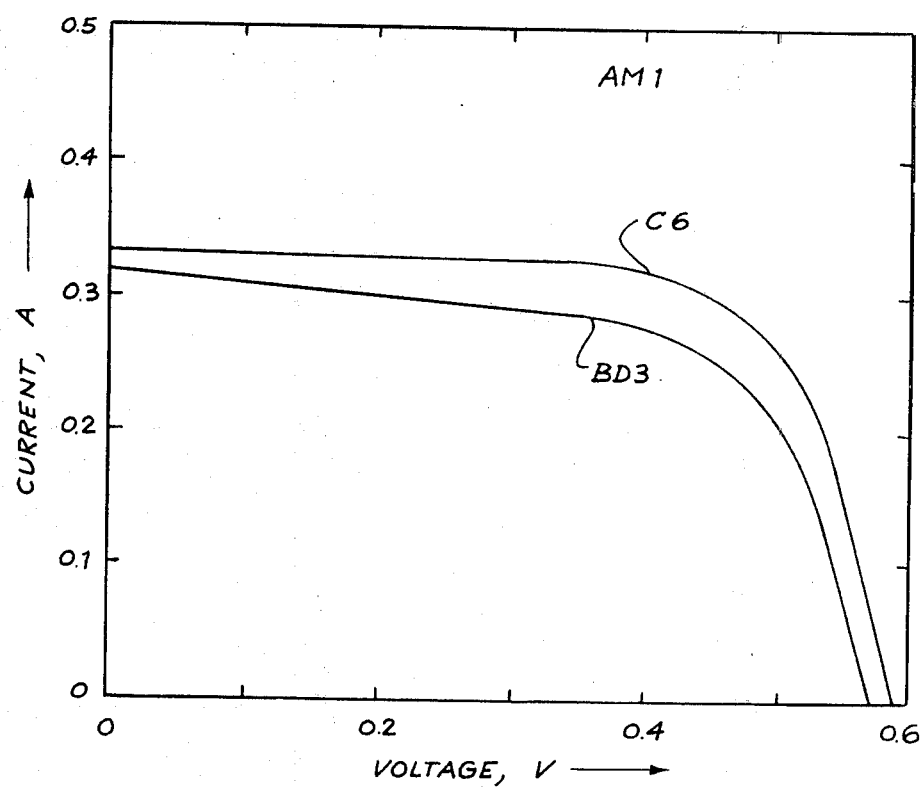
Figure 9:
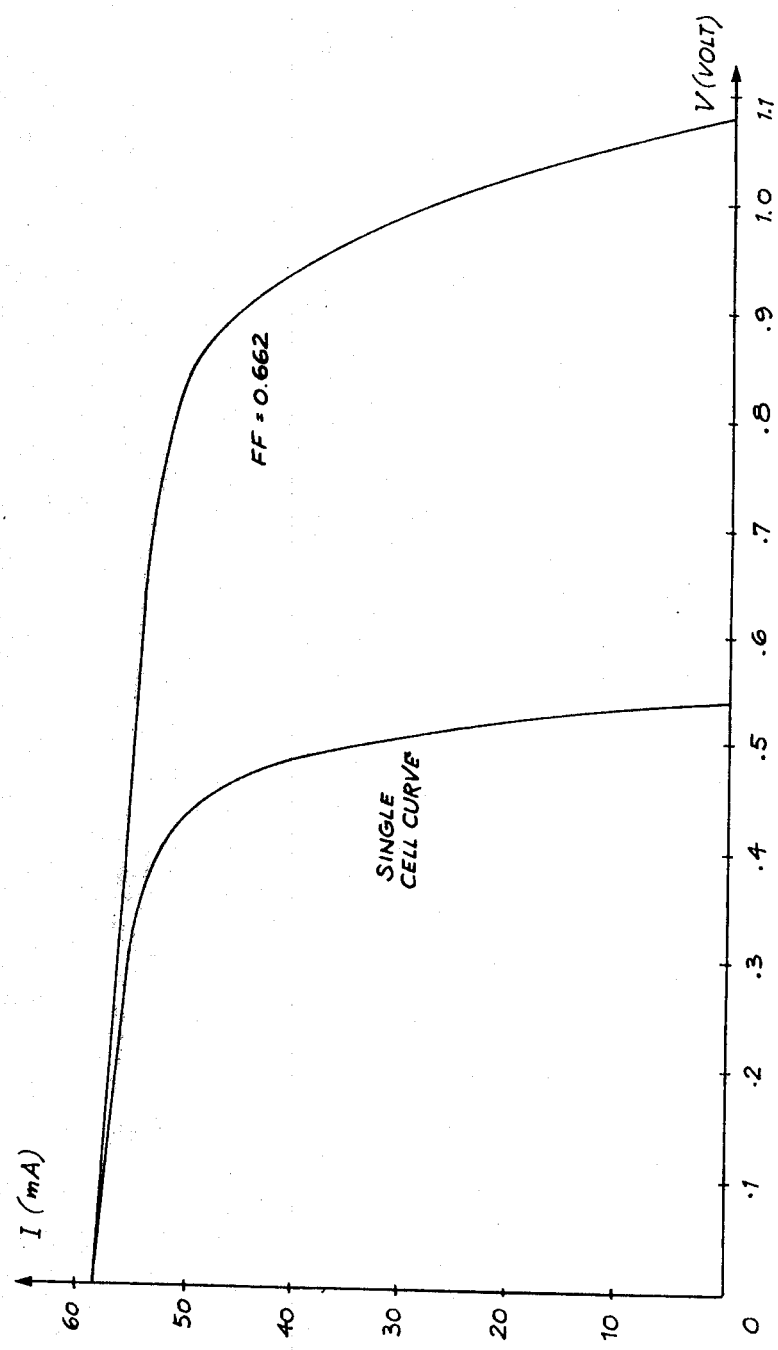
Figure 10:
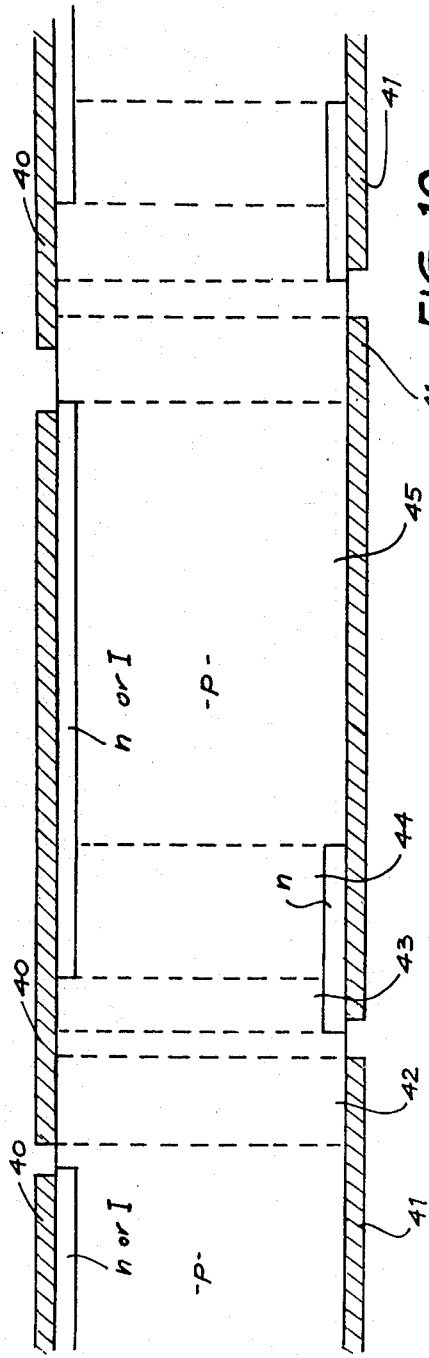
Figure 11A:
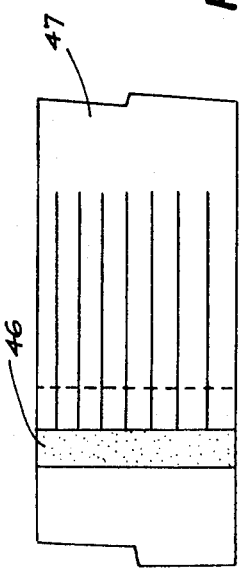
Figure 11B:
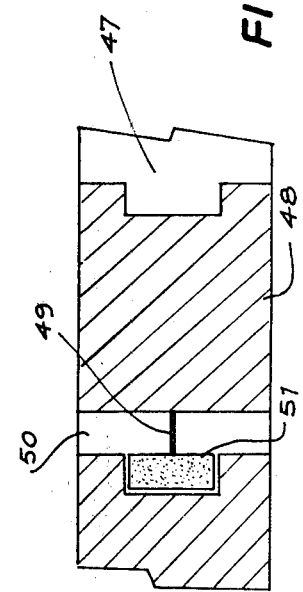

FIGS. 3a, 3b, 3c and 3d schematically illustrate three different processing approaches to producing the bypass diode;

FIG. 4 graphically represents the dark current-voltage characteristics of a p-n junction cell with an integrated shunting diode (this embodiment of a bypass diode being designated as "BD3");

FIG. 5 is a graphical representation of the output characteristics of a p-n junction cell with an integrated shunting diode—indicated as BD3—under illumination, compared to a control device—indicated as C6—processed similarly but without the bypass diode;

FIG. 6 is a graphical illustration of the output-voltate characteristics of the same cell, when connected in series with a number of other cells, with integrated shunting diode (BD3) under illumination with different shading conditions;

FIG. 7 is a schematic representation of a cross-sectional side elevational view of integrated solar cells;

FIG. 8a and 8b are top elevation and side elevation views, respectively, of a series connected array of MIS solar cells;

FIG. 9 graphically illustrates the output current-voltage curves for a single MIS cell and for two MIS cells interconnected on the same substrate;

FIG. 10 schematically illustrates the series interconnection of solar cells with a shunting diode for each cell; and FIG. 11a and 11b schematically illustrates top and bottom elevational views, respectively of an integrated solar cell with a bypass diode.

Figure 1A:
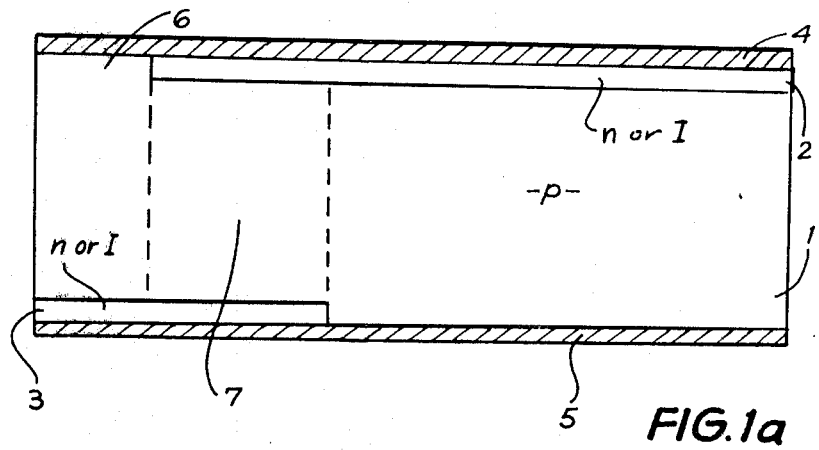

The basic structure of the cell with shunting diode in accordance with the invention is shown in cross section in FIG. 1(a). The cell comprises a silicon wafer 1 doped with a p-type impurity to provide the p-type substrate diffused or formed with top and bottom n-type regions or insulating layers 2 and 3, onto which the top and rear metallic contacts, 4 and 5 respectively are formed. A diode in reverse polarity to the solar cell is integrated into the cell structure and isolated from the main cell area by the lateral resistance of the bulk of the cell. As shown in FIG. 1(a), the cell is nominally divided into three areas: main cell 1, isolation region 7 and bypass diode 6.

Figure 1B:
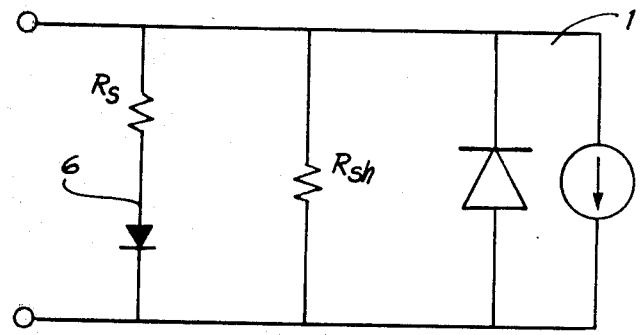

The equivalent circuit of the structure under illumination is shown in FIG. 1(b). Not only is the shunting diode added to the equivalent circuit but a parasitic series resistance $R_s$ and a parasitic shunt resistance $R_{sh}$ are also introduced. By controlling the area of the bypass diode and the width of the isolation region it is possible to control the values of parasitic resistance and to tailor the cells to particular performance requirements.

The shunt resistance introduces additional power loss when the cell is operating normally while the series resistance does so when the shunting diode is in operation. Additionally the area of the cell required for the shunting diode is wasted from the point of view of photovoltaic power generation, as is some of the area of the isolation region. The shunting diode is designed to minimize these losses. For cells representative of present technology, the losses can be kept insignificantly small. For example, for a 100 mm diameter cells, the combined loss due to the shunting diode can be kept below 3% of the total cell output. It is possible to locate the shunting diode under contact pads or cell busbars to further reduce the active area of the cell used by this diode.

Figure 2:
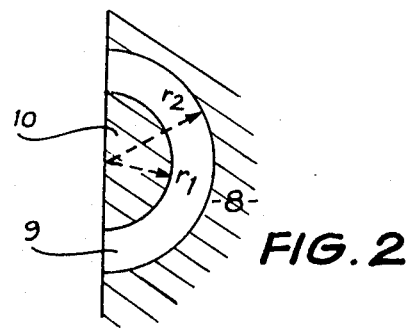
FIG. 2 illustrates a semi-circular configuration for an integrated bypass diode.

The optimum geometry of the shunting diode depends on the particular cell design. A good general purpose geometry of the bypass diode from the top of the cell is the semicircular shape shown in FIG. 2, wherein the main cell 8 is separated from the bypass diode 10 by means of the isolation region 9, whose width is determined by radii $r_1$ and $r_2$.

Figure 3A:
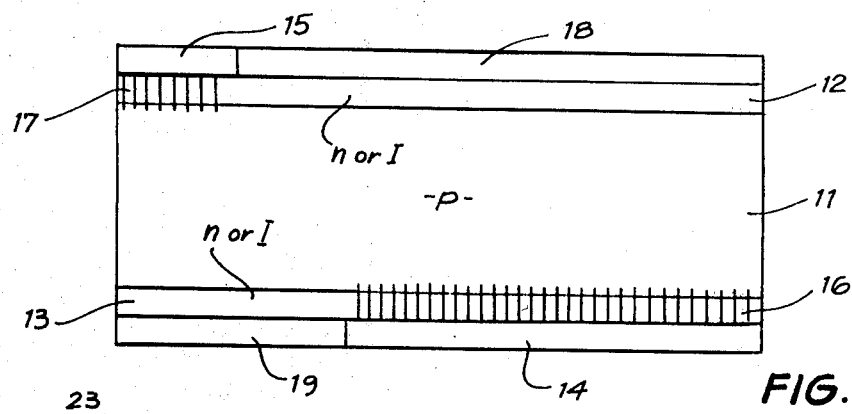
Figure 3B:
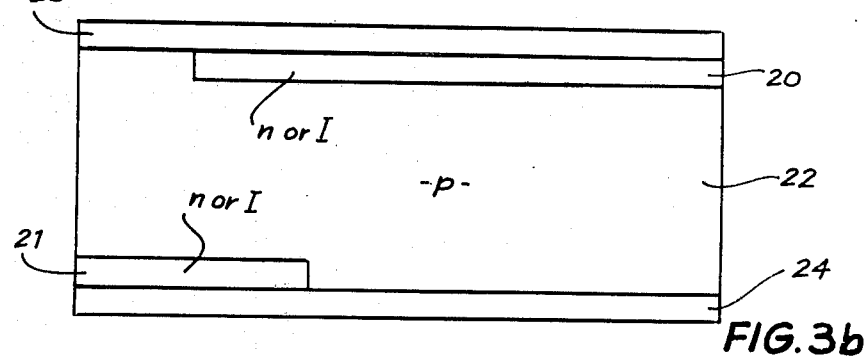

A preferred method of manufacturing p-n junction and MIS solar cells with the integrated shunting diode is to use the same method of manufacture as described above with the following modifications. Referring to FIG. 3(a), the p-type substrate 11 is provided with top and rear n-type layers (or thin insulating layers 12 and 13, respectively). The ohmic back contact (metal layer 14) is deposited over a defined region as indicated in FIG. 3(a). Prior to the deposition of the top contact, an additional metal layer 15 is deposited on the top of the silicon substrate with a definite relationship to the patterned ohmic contact 16 on the back of the wafer as also indicated in FIG. 3(a). Subsequent heating of the substrate allows this metal layer 15 to make ohmic contact to the underlying p-type substrate through the thin diffused layer or the thin oxide layer 12, as shown at 17. As well as depositing the top contact to the cell (metallic layer 18) as in normal processing, a similar deposition is made to the rear of the cell (metal layer 19). This contacts the thin diffused layer or acts as a rectifying MIS contact by virtue of the thin underlying oxide layer 12 or 13. Alternatively, a more sophisticated approach would be to use localized heating, for example by laser or electron pulse heating, to define the areas where ohmic contact is to be made.

A second approach is to again use the method of manufacture as previously described for devices not incorporating the shunting diode with the following modifications. The layers of introduced dopants or the thin oxide layer (20 and 21) are formed selectively in the semiconductor substrate 22 as in FIG. 3(b). This can be accomplished by selective masking prior to formation of this layer or by selectively removing it after formation. Fabrication after this point is as for normal devices to deposit top and rear contacts 23 and 24, respectively.

Figure 3C:
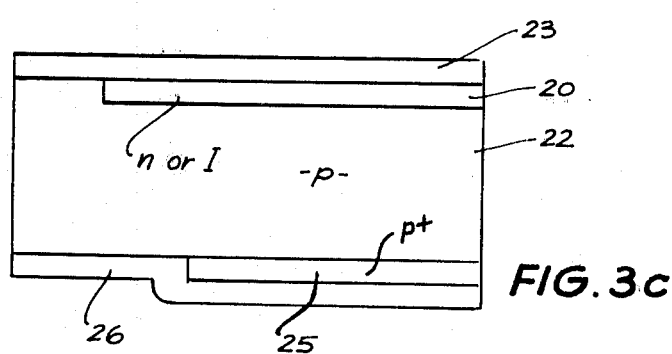
Figure 3D:
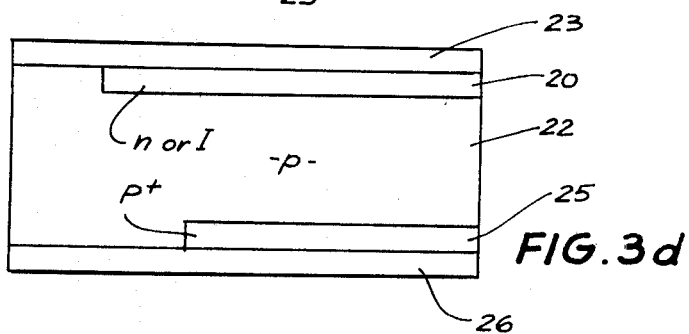

Intermediate approaches using the rectifying properties of metal-semiconductor contacts are shown in FIGS. 3(c) and 3(d). In FIGS. 3(c) and 3(d) a heavily doped semiconductor layer 25 is formed selectively on or in the p-type substrate before or after depositing the rectifying rear metal contact layer 26. The rectifying properties of the metal contact layer 26 are eliminated selectively by the heavily doped layer 25.

In embodiments of p-n junction and MIS devices which have been fabricated using the first method described above, the current versus voltage output curve of a p-n junction cell with an integrated shunting diode is shown in FIG. 4. The cell was of 1 $\Omega$cm resistivity, 280 $\mu$m thickness and of 50 mm diameter. A semicircular shunting diode geometry was used of radius 3 mm. The radius of the isolation region was 10.5 mm. These dimensions are non-optimal. FIG. 4 clearly demonstrates the expected back-to-back diode characteristics of the device in the dark.

Under illumination, the same device demonstrates the output current-voltage characteristics labelled 'BD3' in FIG. 5. Under the same illumination, a control device without the bypass diode displays the characteristics labelled 'C6'. A drop in peak output power is apparent but this drop can be minimized if the bypass diode design is optimized. When the cell with integrated shunting diode is connected in series with eighteen conventional cells of a similar size, output current-voltage characteristics are obtained as shown in FIG. 6 as the curve labelled 'full output'. When one of the conventional cells in the series is shaded, the output drops dramatically, as expected, to the dotted line in FIG. 6. However even when the cell with the integrated bypass diode is fully shaded, there is only a modest loss in output power, again as expected.

Cells can be interconnected on a single substrate using the basic structure shown in FIG. 7. This technique is particularly appropriate for material produced continuously, such as silicon ribbon. The individual cells in the array (the main cell being indicated as 31 in FIG. 7) are series interconnected by virtue of their being a low resistance from the top to back contact (indicated as 27 and 28, respectively) in selected areas labelled 29 (known as the 'shorting region') in FIG. 7. Successive cells are isolated by the lateral resistance of the isolation region. A parasitic series resistance is introduced into the series interconnection by the bulk resistance of the shorting region 29 while a parasitic shunt resistance is introduced by the lateral resistance of the isolation region 30. These resistances can be controlled by controlling the dimensions of the respective regions. In any array of series interconnected cells so produced, the arrangement shown in FIG. 7 of an isolation region 3 separating a main cell 31 and a shorting region is repeated, according to the number of cells in the array.

A preferred method of manufacturing the series connected array for MIS solar cells is to use the same method of manufacture as for discrete devices with the following modifications. The multiple top and bottom contacts 37 and 35 are deposited with the spatial relationship as indicated in FIGS. 8a and 8b. An additional processing step is introduced prior to the deposition of the multiple top contacts whereby an additional metal layer 34 is deposited on the top of the silicon substrate 22 in the pattern indicated in FIG. 8b. The substrate is subsequently heated to allow this metal layer 34 to make ohmic contact to the underlying substrate 22 through the thin oxide layer 33. Alternatively, selective heating, for example, by laser or electron beam pulsing could achive this without the additional metal deposition step. Similarly, ohmic contact is made between the bottom contact 35 and the overlying semiconductor 36 through the thin oxide layer, as shown at 36.

A similar approach could be used to fabricate interconnected p-n junction cells, although in this case additional parasitic shunt resistance could be introduced by the lateral resistance of the thin layer of impurities in region 38 and 39 of FIG. 8b. A preferred approach in this case is to selectively determine the regions where the n-type impurites are located, for example, either by selective masking prior to their introduction or by selective removal after introduction by chemically etching away in unwanted regions.

Referring to FIG. 8b, the width 'a' provides the area of interconnection between adjacent cells and determines the series parasitic resistance. The width 'b' provides isolation between adjacent cells and determines the parasitic shunt resistance. Ideally, the parasitic shunt resistance is maximized whilst the parasitic series resistance is minimized. By controlling the widths of 'a' and 'b' it is possible to control the values of parasitic resistance and to tailor the cells to particular performance requirements.

Experimental interconnected MIS solar cells can be fabricated on the same substrate using the preferred method previously described for these devices. In one embodiment, the substrate was 10 Ωcm silicon, 300 μm thick. Two cells were interconnected, occupying a total area of 5.7 cm². The output current-voltage curve of an individual cell under illumination is shown in FIG. 9. Also shown is the output curve of the two MIS cells interconnected on the same substrate. These maintain identical current output while doubling the voltage output, as expected.

Combining the features of series interconnection of cells with a shunting diode for each cell in accordance with the invention provides for the arrangement shown in FIG. 10. The particular spaced arrangement of top and rear metal contacts 40 and 41 and n-type regions on the substrate provides distinct shorting (42), shunting diode (43), isolation (44) and main cell (45) regions. Even if one cell is shaded, it is still possible to get the same current out of the series interconnected array. Moreover, because of the redundancy provided by the bypass diode, cells defective from the time of manufacture can be included in the series connection without reduction in output. As can be seen from FIG. 10, only one isolating region 44 is required to achieve both series connection and shunting protection.

A possible geometry for the bypass diode is shown in FIGS. 11a and 11b, representing top and rear views of a solar cell with bypass diode. The grid contacts and shorting bar 46 on the substrate 47 are shown in the front or top view of the cell illustrated in FIG. 11a. In the back or rear view, FIG. 11b, the back contact 48 is shown separated from the adjacent bypass diode 51 by the isolation region 50, except for the narrow conductive path 49.

A preferred method of manufacturing the series interconnection array of solar cells with shunting diodes is a combination of the previous methods.

Although the invention has been described above with reference to preferred embodiments and drawings, it will be appreciated that numerous variations, modifications or alternatives may be substituted for specifically described features, without departing from the spirit or scope of the invention as broadly described. For example, although the drawings show a p-type substrate with n-type layers, these may be reversed as required.

What I claim is:

1. A solar cell with integral shunting diode, comprising a wafer of semiconductor substrate material having top and bottom metal contact layers having at least some contact with said substrate either directly or indirectly through an intermediate layer of different dopant type or an insulating layer, wherein said layer is nominally divided into three contiguous regions including a shunting or bypass diode region and a main cell region separated by an intermediate isolation region, wherein said main cell region comprises a portion of the substrate having top and bottom metal contacts, one of which is either directly or indirectly in contact with said substrate and the other of which is separated from said substrate by means of an intermediate layer of different dopant type or an insulating layer, said isolation region comprises a portion of the substrate which is separated from each of said top and bottom metal contacts by an intermediate layer of diffent dopant type or an insulating layer, and said bypass diode region comprises a portion of the substrate having top and bottom metal contacts, one of which is either directly or indirectly in contact with said substrate and the other of which is separated from said substrate by means of an intermediate layer of different dopant type or an insulating layer, and wherein said bypass diode is in electrical communication with said main cell by means of a narrow conductive path joining said bypass diode with said main cell.

2. A method of manufacturing a solar cell with integral shunting diode, comprising forming top and bottom metal contact layers on a wafer of semiconductor substrate material wherein said metal layers have at least some contact with said substrate either directly or indirectly through an intermediate layer of different dopant type or an insulating layer, wherein the formation of metal contact layers and layers of different dopant type or an insulating layers is controlled such that said cell is nominally divided into three contiguous regions including a shunting of bypass diode region and a main cell region separated by an intermediate isolation region, wherein said main cell region comprises a portion of the substrate having top and bottom metal contacts, one of which is either directly or indirectly in contact with said substrate and the other of which is separated from said substrate by means of an intermediate layer of different dopant type or an insulating layer., said isolation region comprises a portion of the substrate which is separated from each of said top and bottom metal contacts by an intermediate layer of different dopant type or an insulating layer, and said bypass diode region comprises a portion of the substrate having top and bottom metal contacts, one of which is either directly or indirectly in contact with said substrate and the other of which is separated from said substrate by means of an intermediate layer of different dopant type or an insulating layer, and wherein said bypass diode is in electrical communication with said main cell by means of a conductive path joining said bypass diode with said main cell.

3. An integrated array of a plurality of solar cells on a single sheet of semiconductor substrate material, comprising a continuous sheet of said substrate having top and bottom metal contact layers having contact with said substrate at spaced intervals, either directly or indirectly through an intermediate layer of different dopant type or an insulating layer, wherein each said cell is nominally divided into three contiguous regions including a main cell region and a shorting or series interconnection region separated by an intermediate isolation region, wherein said main cell region comprises a portion of the substrate having top and bottom metal contacts with the intermediate layer of different dopant type or insulating layer separating one of said metal contacts from said substrate, and said main cell region is contiguous with the shorting region of the next adjacent cell, said isolation region, adjacent said main cell region, comprises a portion of the substrate having only one metal contact and an underlying layer of different dopant type or an insulating layer, both of which are contiguous with the corresponding metal contact and intermediate layer of different dopant type or insulating layer in said main cell region, and said shorting or series interconnection region comprises a portion of the substrate in contact with both top and bottom metal contacts, one of which metal contacts is also in contact with the main cell region of the next adjacent cell.

4. A method of forming a plurality of integrated solar cells on a single sheet of semiconductor substrate material, comprising forming top and bottom metal contact layers on said substrate wherein said metal layers have at least some contact with said substrate at spaced intervals, either directly or indirectly through an intermediate layer of different dopant type or an insulating layer, wherein the formation of metal contact layers and layer of different dopant type or insulating layers is controlled such that each said cell is nominally divided into three contiguous regions including a main cell region and a shorting or series interconnection region separated by an intermediate isolation region, wherein said main cell region comprises a portion of the substrate having top and bottom metal contacts with the intermediate layer of different dopant type or insulating layer separating one of said metal contacts from said substrate, and said main cell region is contiguous with the shorting region of the next adjacent cell, said isolation region, adjacent said main cell region, comprises a portion of the substrate having only one metal contact and an underlying layer of different dopant type or an insulating layer, both of which are contiguous with the corresponding metal contact and intermediate layer of different dopant type or insulating layer in said main cell region, and said shorting or series interconnection region comprises a portion of the substrate in contact with both top and bottom metal contacts, one of which metal contacts is also in contact with the main cell region of the next adjacent cell.

5. An integrated array of a plurality of solar cells on a single sheet of semiconductor substrate material, with each cell in the array shunted by a diode, comprising a continuous sheet of said substrate having top and bottom metal contact layers having contact with said substrate at spaced intervals, either directly or indirectly through an intermediate layer of different dopant type or an insulating layer, wherein each said cell is nominally divided into several regions including contiguous shunting diode, isolation, and main cell regions, with the isolation region being intermediate the said main cell and shunting diode regions, and a separate shorting or series interconnection region spaced and electrically isolated from the shunting diode region, wherein said main cell region comprises a portion of the substrate having top and bottom metal contacts with the intermediate layer of different dopant type or insulating layer separating one of said metal contacts from said substrate, and said main cell region is contiguous with the shorting region of the next adjacent cell, said isolation region, adjacent said main cell region, comprises a portion of the substrate with both top and bottom metal contacts isolated from said substrate by means of an intermediate layer of different dopant types or an insulating layer, said shunting diode region comprises a portion of the substrate having top and bottom metal contacts, one of which is either directly or indirectly in contact with said substrate and the other of which is separated from said substrate by means of an intermediate layer of different dopant type or an insulating layer, and wherein said shunting diode is in electrical communication with said main cell by means of a conductive path joining said shunting diode with said main cell, and said shorting or series interconnection region comprises a portion of the substrate in contact with both the top and bottom metal contacts, one of which metal contacts is also in communication with the main cell region of the next adjacent cell.

6. A method of forming an integrated array of a plurality of solar cells on a single sheet of semi-conductor material with each cell in the array shunted by a diode, comprising forming top and bottom metal contact layers on said substrate wherein said metal layers have contact with said substrate at spaced intervals, either directly or indirectly through an intermediate layer of different dopant type or an insulating layer wherein the formation of metal contact layers and layer of different dopant type or insulating layers is controlled such that each said cell is nominally divided into several regions including contiguous shunting diode, isolation, and main cell regions, with the isolation region being intermediate the said main cell and shunting diode regions, and a separate shorting or series interconnection region spaced and electrically isolated from the shunting diode region, wherein said main cell region comprises a portion of the substrate having top and bottom metal contacts with the intermediate layer of different dopant type or insulating layer separating one of said metal contacts from said substrate, and said main cell region is contiguous with the shorting region of the next adjacent cell, said isolation region, adjacent said main cell region, comprises a portion of the substrate with both top and bottom metal contacts isolated from said substrate by means of an intermediate layer of different dopant type or an insulating layer, said shunting diode region comprises a portion of the substrate having top and bottom metal contacts, one of which is either directly or indirectly in contact with said substrate and the other of which is separated from said substrate by means of an intermediate layer of different dopant type or an insulating layer, and wherein said shunting diode is in electrical communication with said main cell by means of an conductive path joining said shunting diode with said main cell, and said shorting or series interconnection region comprises a portion of the substrate in contact with both the top and bottom metal contacts, one of which metal contacts is also in communication with the main cell region of the next adjacent cell.

* * * * *